United States Patent
Park

(10) Patent No.: US 6,674,482 B1
(45) Date of Patent: Jan. 6, 2004

(54) APPARATUS FOR GENERATING SYNC OF DIGITAL TELEVISION

(75) Inventor: Dong Ho Park, Kyunggi-Do (KR)

(73) Assignee: LG Electronics Inc., Seoul (KR)

( * ) Notice: Subject to any disclaimer, the term of this patent is extended or adjusted under 35 U.S.C. 154(b) by 307 days.

(21) Appl. No.: 09/642,153

(22) Filed: Aug. 21, 2000

(30) Foreign Application Priority Data

Aug. 21, 1999 (KR) ........................................ 1999/34806

(51) Int. Cl.[7] ................................................. H03L 7/00
(52) U.S. Cl. ........................ 348/536; 348/521; 348/541; 348/547
(58) Field of Search ................................. 348/536, 537, 348/540, 541, 547, 441, 512, 513, 715, 521, 524; H04N 5/06, 9/45, 9/455; H03L 7/00

(56) References Cited

U.S. PATENT DOCUMENTS

| | | | | |
|---|---|---|---|---|
| 4,746,996 A | * | 5/1988 | Furuhata et al. | ............ 360/36.2 |
| 5,132,793 A | * | 7/1992 | Hirahata et al. | ............. 348/449 |
| 5,253,118 A | * | 10/1993 | Konno | ........................ 360/10.1 |
| 6,107,984 A | * | 8/2000 | Naka et al. | ...................... 345/99 |
| 6,310,922 B1 | * | 10/2001 | Canfield et al. | ............ 348/524 |

* cited by examiner

Primary Examiner—Michael H. Lee
Assistant Examiner—Trang U. Tran
(74) Attorney, Agent, or Firm—Birch, Stewart, Kolasch & Birch, LLP

(57) ABSTRACT

An apparatus for generating a sync of a digital television in which an analog signal inputted to a digital television constantly provides stabilized synchronization regardless of a standard or a nonstandard so as to be processed. The apparatus for generating a sync of a digital television in which an analog component data inputted from a component data (YcbCr) write controller is converted to a digital data and the converted digital data is stored in a frame buffer, includes: a vertical sync phase controlling unit for varying a clock frequency of a voltage control crystal oscillator according to a phase difference between an input vertical sync (Vsync_in) and a vertical sync (Vsync) generated in a final output terminal, to reduce the phase difference; a component data read controlling unit for dividing the clock frequency, outputting a read control signal to read the signal stored in the frame buffer in synchronization with the clock frequency, and outputting a horizontal and a vertical sync signals (Hsync)(Vsync); a frequency converter for converting the output frequency to form a display clock; a format converter for converting the digital signal as read from the frame buffer according to the horizontal and the vertical sync signal (Hsync)(Vsync) outputted from the component data read controlling unit to a display format and outputting the format-converted signal for display according to a display clock outputted from the frequency converter.

16 Claims, 2 Drawing Sheets

FIG. 2A VSYNC_IN 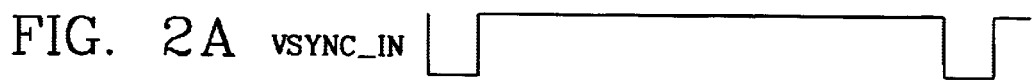
FIG. 2B VSYNC 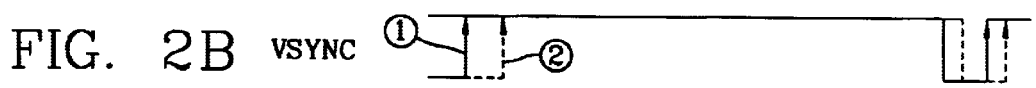
FIG. 3
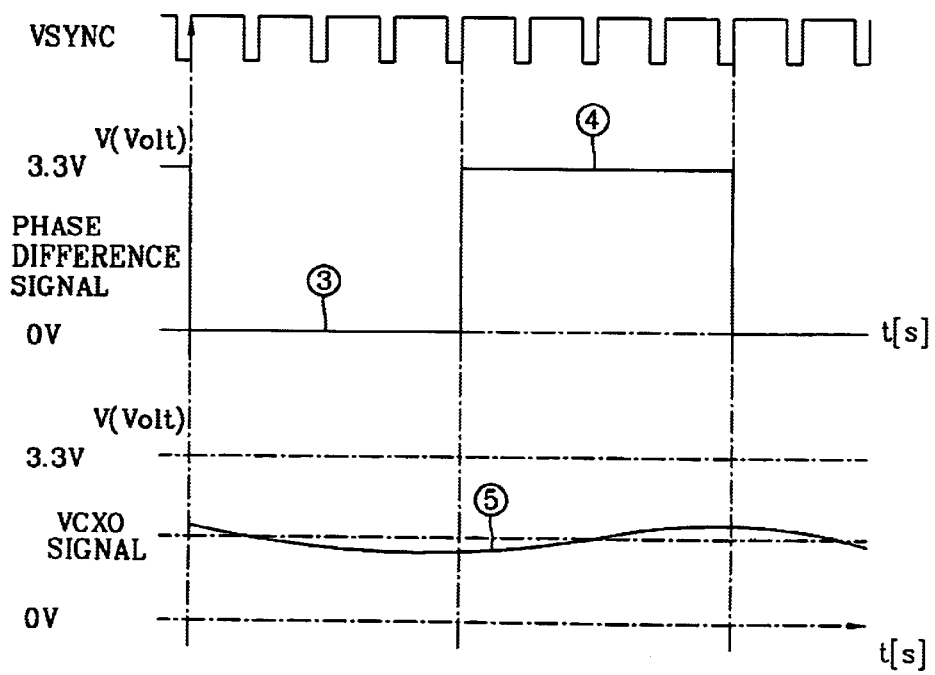

APPARATUS FOR GENERATING SYNC OF DIGITAL TELEVISION

BACKGROUND OF THE INVENTION

1. Field of the Invention

The present invention relates to an apparatus for generating a sync of a digital television, and more particularly, to an apparatus for generating a sync of a digital television which provides a stabilized synchronization to an analog signal inputted thereto so as to be processed regardless of a standard system or a nonstandard system.

2. Description of the Background Art

Currently, digital television and analog television coexist. Accordingly, digital televisions format-converts an analog image signal of an NTSC (national television systems committee) through a digital signal processing for displaying it as well as displaying a 18-format digital image stream of an ATSC (advances television systems committee).

When the NTSC analog image signal is format-converted to a high definition (HD) to be displayed, a clock and sync signal related to display is determined by the number of frames included in a digital image stream in the ATSC system and a picture resolution. And in case that the NTSC analog image and VGA signal are displayed on the same resolution their clock and sync signal generation structures related to display are to be the same each other.

The ATSC system includes two standardized display mode of 59.9 Hz and 60 nz Thus its display clock accordingly has a selective clock For example, in case that it's a display mode of an interlaced scanning method having a screen resolution of 1920×1080, a horizontal sync is 2200 clock and a vertical sync is 562 5 line, its display clock has 74.175 MHz and 74.25 MHz for the 55.94 Hz and 60 Hz, respectively.

However, the digital television originally designed to process the standardized sync signal such as the ATSC digital image stream in accordance with the conventional art as described above has the follow leveling problems when it processes nonstadardized signals such as the NTSC analog image signal.

First, when the digital television (DTV) is designed to process both a digital data and an analog signal, the ATSC system and the NTSC system are independently designed. In this case, it is difficult to implement a unified user interface in a single system for the two sources of the ATSC and the NTSC. Also, an additional function such as a PIP (picture in picture) is hardly implemented.

Secondly, in order to implement a unified user interface (UI) regardless of an analog or a digital input signal in a system, a stable display sync should be provided for whatever case that an ATSC-converted signal is inputted or that an NTSC-converted signal is inputted. For this purpose, for the NTSC analog image signal, a nonstandard signal can be stabilized by a time base correction (TBC) processing. In this case, however, field skip or repeat occurs periodically for the standard signal before or after the TBC processing, which causes variation in a frame ratio and thus, a time display error is generated in a motion picture.

Nevertheless, if an output sync is unconditionally locked with an input sync, since the unstable input sync in the nonstandard case is transmitted to the output screen as it is, the unstable display synchronization affects a deflection unit, inevitably causing a screen instability and OSD flickering Thirdly, in case where the processing method for a standard signal and a nonstandard signal is divided by a lock and unlock method, the follow leveling problems arise. That is, when a general broadcasting signal, that is, a standard signal, is instantly weakened and is erroneously recognized as a nonstandard signal and then returns to its normal state to be re-recognized as a standard signal, there is a sync instability according to the signal transition period. In addition, a sync signal is unstable due to a forcible conversion such as a function of normal play a pause function for suspending a picture of a screen and two-time speeding in a VCR.

SUMMARY OF THE INVENTION

Therefore, an object of the present invention is to provide an apparatus for generating a sync signal of a digital television ensuring a stable synchronization for processing an analog signal regardless of whether an external input signal (i.e., an analog signal) inputted to a digital television is a standard signal or a nonstandard signal.

To achieve these and other advantages and in accordance with the purpose of the present invention, as embodied and broadly described herein, there is provided an apparatus for generating a sync signal of a digital television in which an analog component data inputted from a component data (YcbCr) write controller is converted to a digital data and the converted digital data is stored in a frame buffer including a vertical sync phase controlling unit for varying a clock frequency of a voltage control crystal oscillator according to a phase difference between an input vertical sync signal (Vsync_in) and a vertical sync signal (Vsync) generated in a final output terminal, to reduce the phase difference; a component data read controlling unit for dividing the clock frequency, outputting a read control signal to read the signal stored in the frame buffer in synchronization with the clock frequency, and outputting a horizontal and a vertical syncs (Hsync)(Vsync); a frequency converter for converting the output frequency to generate a display clock; a format converter for converting the digital signal as read from the frame buffer according to the horizontal and the vertical syncs (Hsync)(Vsync) outputted from the component data read controlling unit to a display format and outputting the format-converted signal for display according to a display clock outputted from the frequency converter These and other objects of the present invention will become more readily apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

FIGS. 2A and 2B are views showing examples of waveforms of an input vertical sync separated from an input NTSC image signal and an output vertical sync generated by a field memory read clock; and FIG. 3 is a view showing examples of output waveforms of an LPF for controlling a voltage control crystal oscillator and a PWM pulse depending on a phase difference between an input vertical sync (Vsync_in) and an output vertical sync (Vsync).

DETAILED DESCRIPTION OF THE PREFERRED EMBODIMENTS

Figure 1:
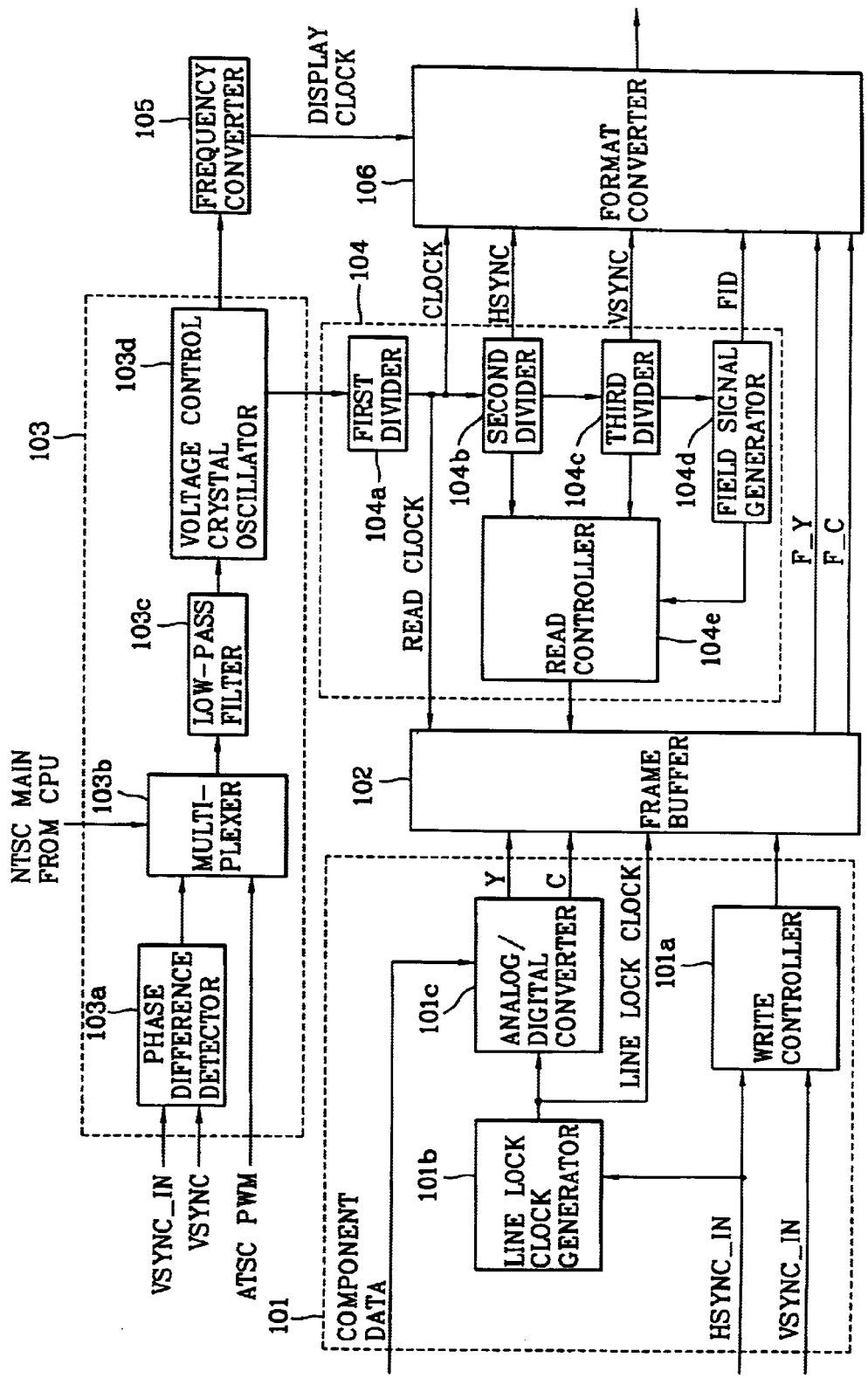
FIG. 1 is a schematic block diagram of an apparatus for generating a sync signal of a digital television in accordance with an embodiment of the present invention.

Reference will now be made in detail to the preferred embodiments of the present invention, examples of which are illustrated in the accompanying drawings.

FIG. 1 is a schematic block diagram of an apparatus for generating a sync of a digital television in accordance with the present invention.

As shown in the drawing an apparatus for generating a sync of a digital television of the present invention includes a component data write controlling unit 101 for converting an analog component data to a digital signal according to a horizontal sync (Hsync_in) and a sync (Vsync_in) separated from an inputted NTSC image signal, and writing the digital signal in a storing unit; a frame buffer 102 for storing the digital signal according to a write control signal outputted from the component data write controlling unit 101 and reading and outputting the stored digital signal according to a read control signal; a vertical sync phase controlling unit 103 for varying a clock frequency of a voltage control crystal oscillator according to a phase difference between an input vertical sync (Vsync_in) and a vertical sync (Vsync) generated in a final output terminal, to reduce the phase difference; a component data read controlling unit for dividing the output frequency outputted from the vertical sync phase controlling unit 103, outputting a read control signal to read the signal stored in the frame buffer 102 in synchronization with the clock frequency, and outputting a horizontal and a vertical sync (Hsync)(Vsync) a frequency converter 105' for converting the output clock outputted from the vertical sync phase controlling unit 103, to form a display clock, a format converter 106 for converting the digital signal as read from the frame buffer 102 according to the horizontal and the vertical sync (Hsync)(Vsync) outputted from the component data read controlling unit 104 to a display format and outputting the signal in the display format according to a display clock outputted from the frequency converter.

The vertical sync phase controlling unit 103 includes a phase difference detector 103a for detecting a phase difference between the vertical sync (Vsync_in) separated from the inputted NTSC analog image signal and the vertical sync (Vsync) generated by the component data read controlling unit; a multiplexer 103b for outputting either one of an ATSC PWM signal and the signal detected by the phase difference detector 103a according to an NTSC main signal outputted from a CPU; a low pass filter 103c for low pass filtering the signal selected by the multiplexer 103b, and a voltage control crystal oscillator 103d for varying the output frequency according to the signal filtered by the low pass filter 103c and outputting it.

The phase difference detector 103a uses a latch.

The component data read controlling unit 104 includes a first divider 104a for dividing the frequency outputted from the voltage control crystal oscillator 103d into a predetermined ratio and generating a read clock; a second divider 104b for dividing the read clock divided by the first divider 104a into a predetermined ratio and generating a horizontal sync (Hsync); a third divider 104c for dividing the horizontal sync (Hsync) divided by the second divider 104b into predetermined broadbands and generating a vertical sync (Vsync); a field signal generator 104d for generating an even field signal or an odd field signal according to the vertical sync (Vsync) divided by the third divider 104c; and a read controller 104e for outputting a read control signal to read a digital signal as stored in the frame buffer 102 according to the horizontal sync (Hsync) of the second divider 104b, the vertical sync (Vsync) of the third divider 104c and the field signal of the field signal generator 104d.

The operation and effect of the apparatus for generating a sync of a digital television of the present invention constructed as described above will now be explained in detail.

First the component data write controlling unit 101 outputs a write control signal and a component data in order to store the component data in the storing unit according to the horizontal sync (Hsyn_in) and the vertical sync (Vsync_in) separated from the inputted NTSC analog image signal That is, when the horizontal sync (Hsync_in) and the vertical sync (Vsync_in) are inputted to a write controller 101a of the component data write controlling unit 101, the write controller 101a outputs a write control signal for writing a component data to the frame buffer 102

And, when the horizontal sync (Hsync_in) is inputted to a line lock clock generator 101b, the line lock clock generator 101b outputs the line lock clock both to the analog/digital converter 101c and to the frame buffer 102b.

Then, an analog/digital converter 101c samples the inputted component data according to the line lock clock generated by the line lock clock generator 101b, converts the sampled component data to digital signals Y and C and outputs them to the frame buffer 102

Then the frame buffer 102 synchronizes the digital signals Y and C outputted from the analog/digital converter 101c according to the write control signal outputted from the write controller 101a, with the line lock clock generated by the line lock clock generator 101b, and stores it.

Meanwhile, in order to synchronize with the digital signals Y and C stored in the frame buffer 102, the vertical sync phase controlling unit 103 outputs a signal for reducing a phase difference between the vertical sync (Vsync_in) separated from the inputted NTSC analog image signal and the vertical sync (Vsync) generated by the output terminal That is, the phase difference detector 103a of the vertical sync phase controlling unit 103 detects the phase difference between the vertical sync (Vsync_in) separated from the inputted NTSC analog image signal and the vertical sync (Vsync) generated by the component data read controlling unit 104 and outputs a resulted signal.

For example, with reference to FIGS. 2A and 2B, in a state that a low level input vertical sync (Vsync_in) as shown in FIG. 2A has been inputted, when a high level output vertical sync (Vsync) is latched as indicated by '1' in FIG. 2B, the phase difference detector 103a outputs a low level pulse as indicated by '3' in FIG. 3 to the multiplexer 103b And, in a state that a high input vertical sync (Vsync_in) has been inputted, when the high level output vertical sync (Vsync) is latched as indicated by '2' in FIG. 2B, the phase difference detector 103a outputs a high level pulse as indicated by '4' in FIG. 3 to the multiplexer 103b.

The multiplexer 103b also receives an ATSC PWM pulse as another input

Then, the multiplexer 103b selects either one of the ATSC PWM and the pulse signal detected by the phase difference detector 103A according to the NTSC main signal transmitted from a CPU (not shown) and outputs the selected one to the low pass filter 103c.

In this respect, in case that the main display mode is the ATSC type, the CPU outputs a low level NTSC main signal, while in case that the main display mode is the NTSC type, the CPU outputs a high level NTSC main signal.

Accordingly, in case that the low level NTSC main signal is inputted from the CPU, the multiplexer 103b selects the ATSC PWM and outputs it to the low pass filter 103c, while in case that the high level NTSC main signal is inputted from the CPU, the multiplexer 103b selects the pulse outputted from the phase difference detector 103a and outputs it to the low pass filter 103c.

The low pass filter 103c low pass filters the pulse outputted from the multiplexer 103b, changes it to a voltage, and outputs the voltage to the voltage control crystal oscillator 103d.

Then, the voltage control crystal oscillator 103d varies the frequency near 27 MHz by virtue of the voltage outputted from the low pass filter 103c and outputs the varied frequency both to the frequency converted 105 and to the component data read controlling unit 104.

That is, in case that the phase difference detector 103a outputs a low level pulse as indicated by '3' in FIG. 3, the low pass filter 103c outputs a reduced control voltage as indicated by '5' in FIG. 3, while in case that the phase difference detector 103a outputs the high level pulse as indicated by '4' in FIG. 3, the low pass filter 103c outputs the gradually increasing control voltage as indicated by '5' in FIG. 3C As the low pass filter 103c outputs the control voltage and the voltage control crystal oscillator 103d outputs the clock frequency the component data read controlling unit 104 receives the frequency output, divides it to a predetermined ratio, generates a read control signal to be read in synchronization with the input and output of the signal stored in the frame buffer 102 and the horizontal and vertical sync signals (Hsync)(Vsync) and provides them to the frame buffer 102 and to the vertical sync phase controlling unit 103.

In detail the first divider 104a of the component data read controlling unit 104 divides the clock frequency controlled through the voltage provided from the vertical sync phase controlling unit 103 to a predetermined ratio, to generate a read clock.

Thusly generated clock is used as a read clock for the frame buffer 102 and also used as an input clock for the format converter 106.

In other words, the first divider 104a divides the 27 MHz frequency outputted from the voltage control crystal oscillator 103d of the vertical sync phase controlling unit 103 into ½ to produce 13.5 MHz frequency, which is used as a read clock of the frame buffer 102 and an input clock of the format converter 106.

Subsequently, the second divider 104b divides the clock as divided by the first divider 104a into 1/858 to produce a horizontal sync (Hsync) and provides the horizontal sync (Hsync) both to the read controller 104e and to the format converter 106.

And, the third divider 104c divides the horizontal sync (Hsync) as divided by the second divider 104b into 1/262.5 to produce a vertical sync (Vsync), and provides the vertical sync (Vsync) to the read, controller 104e, to the format converter 106 and to the field signal generator 104d.

Then the field signal generator 104d generates an even field signal or an odd field signal according to the vertical sync (Vsync) divided by the third divider 104c Then, the read controller 104e outputs a read control signal to read the component data stored in the frame buffer 102 according to the horizontal sync (Hsync) produced by the second divider 104b the vertical sync (Vsync) produced by the third divider 104c and the even or odd field signal of the field signal generator 104d.

In detail, in case that the low pass filter 103c of the vertical sync phase controlling unit 103 outputs a reduced control voltage as indicated by '5' in FIG. 3, the frequency of the voltage control crystal oscillator 103d becomes low, so that the frequencies of the horizontal and the vertical syncs (Hsync)(Vsync) of the component data read controlling unit 104 become low and its period is lengthened. Thus, when the read controller 104e reads the data of the frame buffer 102, the vertical sync (Vsync) advances more than the input vertical sync (Vsync_in) in the right direction.

And, in case that the voltage control crystal oscillator 103d of the vertical sync phase controlling unit 103 outputs the increasing control voltage as indicated by '5' in FIG. 3, the frequencies of the horizontal and vertical sync signals (Hsync)(Vsync) of the component data read controlling unit 104 become high and its period is shortened. Thus, when the read controller 104e reads the data of the frame buffer 102, the vertical sync (Vsync) advances more than the input vertical sync (Vsync_in) in the left direction.

Consequently, the output vertical sync (Vsync) is latched between '1' and '2 of FIG. 2 with respect to the input vertical sync (Vsync_in), the two vertical sync signals are locked, so that when the read controller 104e reads the data of the frame buffer 102 its fields are sequentially displayed without passing over The coverage of the nonstandard signal operable in the lock mode with the standard vertical sync is dependent on a pullability of the voltage control crystal oscillator 103d and the bandwidth of the low pass filter 103c.

The greater the pullability is and the wider the bandwidth of the low pass filter is, the greater the locking coverage becomes.

For example, in case that a pullability is ±100 ppm, an input signal having a 0.01% phase difference of a vertical sync period can be theoretically locked in each field by the control voltage of the voltage control crystal oscillator 103d.

However, since a control voltage passing through a low pass filter 103c that is practically designed has voltage values of narrower range centering an intermediate voltage, rather than having the values of 0 V and 3.3 V (or 5 V), the range of the image signal that is substantially locked is more reduced.

Nevertheless, sources such as a broadcast signal, a DVD and a VTR player are sufficiently included in the locking range.

A signal such as a VTR trick that is not included in the locking coverage is naturally changed to an unlock mode, and the sync become obviously stable and the picture quality is never degraded.

In addition when the lock mode is changed to the unlock mode or when the unlock mode is changed to the lock mode, there is no sync instability or picture degradation due to the transition period.

In this manner, the sync is stably processed regardless of the standard signal or the nonstandard signal, and thus, the picture quality is not degraded.

In this state, the frame buffer 102 reads out the digital signal Y and C as stored according to the read control signal outputted from the read controller 104e of the component data read controlling unit 104

That is the frame buffer 102 outputs the digital signal f_Y and f_C of the even field to the format converter 106 according to the control signal of the even field outputted from the read controller 104e of the component data read controlling unit 104.

In addition, the frame buffer 102 outputs the digital signal f_Y and f_C of the odd field to the format converter 106 according to the control signal of the odd field outputted from the read controller 1043 of the component data read controlling unit 104.

At this time, the frequency converter 105 receives the 27 MHz frequency from the voltage control crystal oscillator 103d of the vertical sync phase controlling unit 103, converts it to a HD-grade display clock of 74.175 MHz, and outputs it to the format converter 106.

For reference, in case that the display resolution is 59.94 Hz interlaced scanning of 1125×2200, a display horizontal frequency is 59.94×1125=33.7 KHz and a display clock frequency is 33.7×2200=74.175 MHz.

Accordingly, the format converter 106 reads the digital signal outputted from the frame buffer 102 according to the signal outputted from the component data read controlling unit 104 converts it to the display format, and outputs the signal as converted to the display format according to the display clock outputted form the frequency converter 105.

Consequently, the voltage control crystal oscillator 103d is varied according to the phase difference between the vertical sync (Vsync_in) separated from the inputted NTSC analog image signal and the output vertical sync (Vsync) divided by the second divider 104c thereby synchronizing the digital signal inputted to and outputted from the frame buffer 102

As so far described, the apparatus for generating a sync of a digital television in accordance with the present invention has the following effects.

First, by guaranteeing the constantly stable synchronization regardless of the standard signal such as the digital data and the nonstandard signal such as the analog signal in the digital television, an additional function such as a unified user interface and a PIP can be implemented in a single system for the both sources of the NTSC and the ATSC.

Secondly, in the digital television, by guaranteeing the constantly stable synchronization regardless of the standard signal and the nonstandard signal, an output sync is variably locked according to an input sync to prevent an unstable input sync at the time of nonstandard signal from transmitting as it is to the output, so that the unstable display sync does not affect the deflection unit, thereby preventing a picture instability and OSD flickering.

Lastly in the digital television, by guaranteeing the constantly stable synchronization regardless of the standard signal and the nonstandard signal, an output sync is variably locked according to an input sync, so that the synchronization instability due to the transition period during which the public broadcast signal, that is, the standard signal, is weakened and recognized as a nonstandard signal can be prevented, and also the screen synchronization instability due to the forcible conversion such as reproducing an external input signal suspending a picture screen or two-time speeding can be prevented as well.

As the present invention may be embodied in several forms without departing from the spirit or essential characteristics thereof, it should also be understood that the above-described embodiments are not limited by any of the details of the foregoing description, unless otherwise specified, but rather should be construed broadly within its spirit and scope as defined in the appended claims, and therefore all changes and modifications that fall within the meets and bounds of the claims, or equivalence of such meets and bounds are therefore intended to be embraced by the appended claims.

What is claimed is:

1. An apparatus for generating a sync of a digital television in which a component data write controlling unit converts an analog component data to a digital signal according to an input horizontal sync and a vertical sync so as to be stored in a frame buffer, the apparatus comprising:

a vertical sync phase controlling unit for varying a clock frequency of a voltage control crystal oscillator according to a phase difference between an input vertical sync (Vsync_in) and a vertical sync (Vsync) generated in a final output terminal, to reduce the phase difference; and a component data read controlling unit for dividing the output frequency outputted from the vertical sync phase controlling unit, outputting a read control signal to read the signal stored in the frame buffer in synchronization with the clock frequency, and outputting a horizontal and a vertical sync (Hsync)(Vsync) to convert the digital signal outputted from the frame buffer to a display format so as to be outputted, wherein the vertical sync phase controlling unit includes:
a phase difference detector for detecting a phase difference between the vertical sync (Vsync_in) separated from an inputted image signal and the vertical sync (Vsync) generated by the component data read controlling unit;
a multiplexer for outputting either one of an ATSC PWM signal and the signal detected by the phase difference detector according to a signal outputted from a CPU;
a low pass filter for low pass filtering the signal selected by the multiplexer; and
the voltage control crystal oscillator for varying the output frequency according to the signal filtered by the low pass filter and outputting it.

2. The apparatus according to claim 1, wherein the phase difference detector includes a latch.

3. The apparatus according to claim 1, wherein the component data read controlling unit includes:
a first divider for dividing the frequency outputted from the voltage control crystal oscillator into a predetermined ratio and generating a read clock;
a second divider for dividing the read clock divided by the first divider into a predetermined ratio and generating a horizontal sync (Hsync);
a third divider for dividing the horizontal sync (Hsync) divided by the second divider into a predetermined ratio and generating a vertical sync (Vsync);
a field signal generator for generating an even field signal or an odd field signal according to the vertical sync (Vsync) divided by the third divider; and
a read controller for outputting a read control signal to read a digital signal as stored in the frame buffer according to the horizontal sync (Hsync) of the second divider, the vertical sync (Vsync) of the third divider and the field signal of the field signal generator.

4. The apparatus according to claim 3 wherein the first divider is a ½ divider.

5. The apparatus according to claim 3, wherein the second divider is a $1/858$ divider.

6. The apparatus according to claim 3, wherein the third divider is a $1/262.5$ divider.

7. An apparatus for generating a sync of a digital television in which a component data write controlling unit converts an analog component data to a digital signal according to an input horizontal sync and a vertical sync so as to be stored in a frame buffer, the apparatus comprising:

a vertical sync phase controlling unit for varying a clock frequency of a voltage control crystal oscillator according to a phase difference between an input vertical sync (Vsync_in) and a vertical sync (Vsync) generated in a final output terminal, to reduce the phase difference; and a component data read controlling unit for dividing the output frequency outputted from the vertical sync phase controlling unit, outputting a read control signal to read the signal stored in the frame buffer in synchronization with the clock frequency, and outputting a horizontal and a vertical sync (Hsync)(Vsync) to convert the digital signal outputted from the frame buffer to a display format so as to be outputted, wherein the component data read controlling unit includes:

a first divider for dividing the frequency outputted from the voltage control crystal oscillator into a predetermined ratio and generating a read clock;

a second divider for dividing the read clock divided by the first divider into a predetermined ratio and generating a horizontal sync (Hsync);

a third divider for dividing the horizontal sync (Hsync) divided by the second divider into a predetermined ratio and generating a vertical sync (Vsync);

a field signal generator for generating an even field signal or an odd field signal according to the vertical sync (Vsync) divided by the third divider; and a read controller for outputting a read control signal to read a digital signal as stored in the frame buffer according to the horizontal sync (Hsync) of the second divider, the vertical sync (Vsync) of the third divider and the field signal of the field signal generator.

8. The apparatus according to claim 7, wherein the first divider is a ½ divider.

9. The apparatus according to claim 7, wherein the second divider is a 1/858 divider.

10. The apparatus according to claim 7, wherein the third divider is a 1/262.5 divider.

11. An apparatus for generating a sync of a digital display device, the apparatus comprising:

a storage unit to store a converted digital signal therein;

a vertical sync phase controlling unit to vary a clock frequency of a voltage control crystal oscillator according to a phase difference between first and second vertical syncs, so as to reduce the phase difference; and a component data read controlling unit to divide the frequency output from the vertical sync phase controlling unit, to output a control signal to read the digital signal stored in the storage unit in synchronization with the clock frequency, and to output a horizontal sync and a vertical sync to convert the digital signal outputted from the storage unit to a display format, wherein the vertical sync phase controlling unit includes:

a phase difference detector for detecting a phase difference between the first vertical sync separated from an inputted image signal and the second vertical sync;

a multiplexer for outputting either one of an ATSC PWM signal and the signal detected by the phase difference detector according to a signal outputted from a CPU;

a filter for filtering the signal selected by the multiplexer; and the voltage control crystal oscillator for varying the frequency output from the vertical sync phase controlling unit according to the signal filtered by the filter.

12. The apparatus according to claim 11, wherein the phase difference detector includes a latch.

13. The apparatus according to claim 11, wherein the component data read controlling unit includes:

a first divider for dividing the frequency output from the voltage control crystal oscillator into a predetermined ratio and generating a read clock;

a second divider for dividing the reading clock divided by the first divider into a predetermined ratio and generating a horizontal sync (Hsync);

a third divider for dividing the horizontal sync (Hysnc) divided by the second divider into a predetermined ratio and generating a vertical sync (Vsync);

a field signal generator for generating an even field signal or an odd field signal according to the vertical sync (Vsync) divided by the third divider; and a read controller for outputting a read control signal to read a digital signal as stored in the storage unit according to the horizontal sync (Hsync) of the second divider, the vertical sync (Vsync) of the third divider and the field signal of the field signal generator.

14. The apparatus according to claim 13, wherein the first divider is a ½ divider.

15. The apparatus according to claim 13, wherein the second divider is a 1/858 divider.

16. The apparatus according to claim 13, wherein the third divider is a 1/262.5 divider.

* * * * *